(12) United States Patent
Ayazi et al.

(10) Patent No.: US 8,063,720 B2
(45) Date of Patent: Nov. 22, 2011

(54) MEMS RESONATORS HAVING RESONATOR BODIES THEREIN WITH CONCAVE-SHAPED SIDES THAT SUPPORT HIGH QUALITY FACTOR AND LOW TEMPERATURE COEFFICIENT OF RESONANT FREQUENCY

(75) Inventors: Farrokh Ayazi, Atlanta, GA (US); Ashwin Samarao, Atlanta, GA (US)

(73) Assignee: Georgia Tech Research Corporation, Atlanta, GA (US)

(*) Notice: Subject to any disclaimer, the term of this patent is extended or adjusted under 35 U.S.C. 154(b) by 285 days.

(21) Appl. No.: 12/570,610

(22) Filed: Sep. 30, 2009

(65) Prior Publication Data
US 2011/0050366 A1   Mar. 3, 2011

Related U.S. Application Data

(60) Provisional application No. 61/238,449, filed on Aug. 31, 2009.

(51) Int. Cl.
 *H03H 9/24* (2006.01)
 *H03H 9/125* (2006.01)
 *H03H 9/46* (2006.01)

(52) U.S. Cl. .......... 333/186; 333/187

(58) Field of Classification Search .......... 333/186–189, 333/197, 200; 310/348, 349, 351, 354, 355, 310/367, 368
See application file for complete search history.

(56) References Cited

U.S. PATENT DOCUMENTS

| | | | |
|---|---|---|---|
| 6,630,871 B2 * | 10/2003 | Ma et al. | 331/116 M |
| 6,870,444 B1 * | 3/2005 | Zurcher et al. | 333/186 |
| 7,176,770 B2 * | 2/2007 | Ayazi et al. | 333/186 |
| 7,215,061 B2 * | 5/2007 | Kihara et al. | 310/309 |
| 2010/0060384 A1 * | 3/2010 | Taniguchi et al. | 333/186 |

OTHER PUBLICATIONS

Ho et al. (2007) "High-Order Composite Bulk Acoustic Resonators", School of Electrical and Computer Engineering, Georgia Institute for Technology, MEMS 2007, Kobe, Japan, Jan. 21-25, 2007, pp. 791-794.

Samarao et al. (2010) "Passive TCFCompensation in High Q Silicon Micromechanical Resonators", IEEE International Conference on Micro Electro Mechanical Systems, Jan. 2010, pp. 116-119.

Samarao et al. (2010) "Intrinsic Temperature Compensation of Highly Resistive High-Q Silicon Microresonators Via Charge Carrier Depletion", Frequency Control Symposium (FCS), 2010 IEEE International, Jun. 1-4, 2010, Newport Beach, California, pp. 334-339.

* cited by examiner

*Primary Examiner* — Barbara Summons
(74) *Attorney, Agent, or Firm* — Myers Bigel Sibley & Sajovec, P.A.

(57) ABSTRACT

A microelectromechanical (MEMs) resonator includes a concave bulk acoustic resonator (CBAR). One embodiment of a CBAR includes a substrate and a resonator body suspended over the substrate by a pair of fixed supports that attach to first and second opposing ends of the resonator body. The resonator body has a first concave-shaped side extending between the first and second ends of the resonator body and a second concave-shaped side extending opposite the first concave-shaped side. The resonator body may be configured to have a minimum spacing of $\lambda/2$ between the first and second concave-shaped sides, where $\lambda$ is a wavelength associated with a resonant frequency of said resonator body.

14 Claims, 4 Drawing Sheets

MEMS RESONATORS HAVING RESONATOR BODIES THEREIN WITH CONCAVE-SHAPED SIDES THAT SUPPORT HIGH QUALITY FACTOR AND LOW TEMPERATURE COEFFICIENT OF RESONANT FREQUENCY

REFERENCE TO PRIORITY APPLICATION

This application claims priority to U.S. Provisional Application Ser. No. 61/238,449, filed Aug. 31, 2009, the disclosure of which is hereby incorporated herein by reference.

STATEMENT REGARDING FEDERALLY SPONSORED RESEARCH OR DEVELOPMENT

This invention was made with Government support under Contract No. ECS-0348286 awarded by the National Science Foundation. The Government may have certain rights in the invention.

FIELD OF THE INVENTION

The present invention relates to integrated circuit devices and, more particularly, to integrated circuit devices having microelectromechanical resonators and timing devices therein.

BACKGROUND OF THE INVENTION

Microelectromechanical (MEMs) resonators can provide small form factor, ease of integration with conventional semiconductor fabrication techniques and high f·Q products. High frequency and high-Q width-extensional mode silicon bulk acoustic resonators (SiBARs) and film bulk acoustic wave resonators (FBARs) have demonstrated atmospheric quality factors (Q) in excess of 10,000 at or above 100 MHz, with moderate motional resistances. Such resonators are disclosed in an article by S. Pourkamali et al., entitled "Low-Impedance VHF and UHF Capacitive Silicon Bulk Acoustic Wave Resonators—Part I: Concept and Fabrication," IEEE Trans. On Electron Devices, Vol. 54, No. 8, pp. 2017-2023, August (2007), the disclosure of which is hereby incorporated herein by reference.

Unfortunately, such resonators may be characterized by relatively high temperature coefficient of frequency (TCF) values that require active compensation using temperature compensation circuits and/or relatively complex fabrication techniques to reduce TCF. Circuit-based compensation techniques typically increase the complexity of a resonator device and increase power consumption. Alternatively, fabrication-based compensation techniques that reduce TCF may cause a reduction in resonator quality factor (Q) and/or increase in resonator insertion loss.

SUMMARY OF THE INVENTION

Microelectromechanical (MEMs) resonators according to embodiments of the present invention utilize passive (e.g., zero power) temperature coefficient of frequency (TCF) techniques that support high-Q characteristics. According to some of these embodiments of the invention, a MEMs resonator includes a concave bulk acoustic resonator (CBAR). A CBAR includes a substrate and a resonator body suspended over the substrate by a pair of fixed supports that attach to first and second opposing ends of said resonator body. The resonator body has a first concave-shaped side extending between the first and second ends of the resonator body and a second concave-shaped side extending opposite the first concave-shaped side. According to additional embodiments of the invention, the resonator body is configured to have a minimum spacing of $\lambda/2$ between the first and second concave-shaped sides, where $\lambda$ is a wavelength associated with a resonant frequency of said resonator body. This spacing of $\lambda/2$ between the first and second concave-shaped sides may be located at a point midway between the first and second ends of the resonator body.

According to additional embodiments of the invention, the substrate includes a drive electrode extending adjacent the first concave-shaped side and a sense electrode extending adjacent the second concave-shaped side. The width of the drive electrode as measured along the first concave-shaped side is less than a spacing between the first and second ends of the resonator body. In particular, the width of the drive electrode as measured along the first concave-shaped side is preferably less than one-half a spacing between the first and second ends of the resonator body and, more preferably, less than one-third a spacing between the first and second ends of the resonator body.

According to still further embodiments of the invention, the width of the resonator body at the first end thereof may be about $3\lambda/4$. This portion of the resonator body acts as a sink for acoustic energy when the resonator is resonating at a resonant frequency determined by the minimum $\lambda/2$ width.

According to still further embodiments of the present invention, a concave bulk acoustic resonator (CBAR) may includes a substrate and a resonator body suspended over the substrate by a pair of fixed supports that attach to first and second opposing ends of the resonator body. The resonator body has a first concave-shaped side extending between the first and second ends of the resonator body and a second concave-shaped side extending opposite the first concave-shaped side. A piezoelectric layer is provided on the resonator body and first and second electrodes are provided on the piezoelectric layer. The first electrode extends across a first of the pair of fixed supports and onto the piezoelectric layer and the second electrode extends across a second of the pair of fixed supports and onto the piezoelectric layer. In some of these embodiments of the invention, the first and second electrodes include fingers that are interdigitated with each other. The resonator bodies within these resonators are also configured to have a minimum spacing of $\lambda/2$ between the first and second concave-shaped sides, where $\lambda$ is a wavelength associated with a resonant frequency of the resonator body. The width of the resonator body at a first end thereof may also be set to about $3\lambda/4$ in order to operate as an acoustic energy sink.

DESCRIPTION OF PREFERRED EMBODIMENTS

Figure 1:
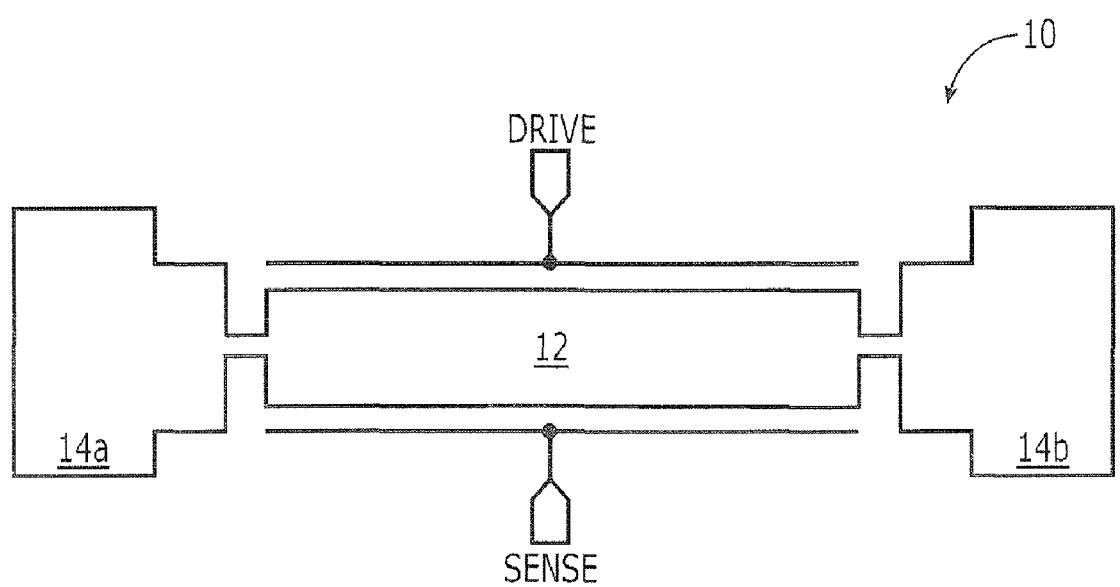
FIG. 1 is a plan view of a silicon bulk acoustic resonator (SiBAR) according to the prior art.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that when an element or layer is referred to as being "on," "connected to" or "coupled to" another element or layer (and variants thereof), it can be directly on, connected or coupled to the other element or layer or intervening elements or layers may be present. In contrast, when an element is referred to as being "directly on," "directly connected to" or "directly coupled to" another element or layer (and variants thereof), there are no intervening elements or layers present. Like reference numerals refer to like elements throughout.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Embodiments of the present invention are described herein with reference to cross-section and perspective illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a sharp angle may be somewhat rounded due to manufacturing techniques/tolerances.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
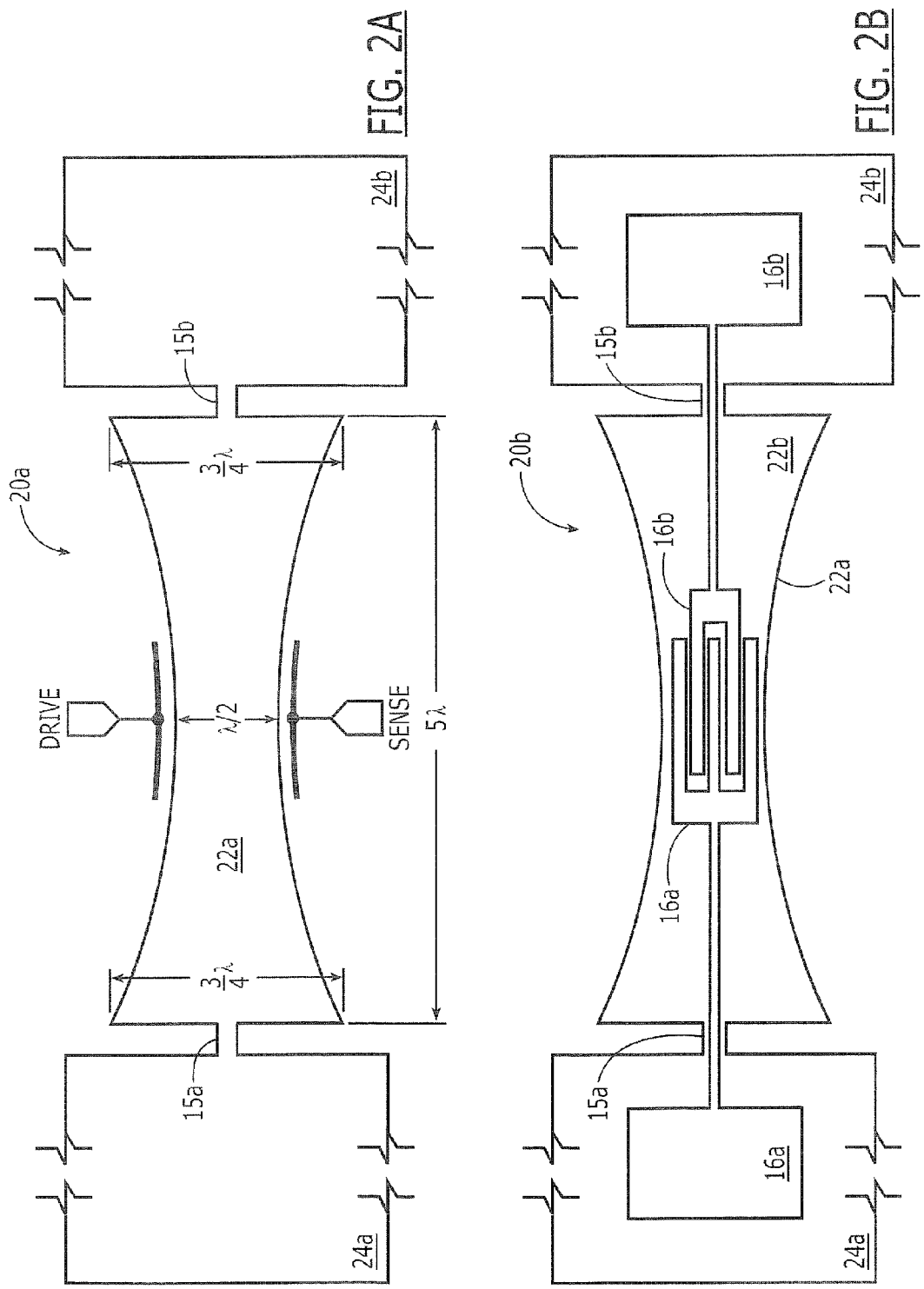
FIG. 2A is a plan view of a concave bulk acoustic resonator (CBAR) according to an embodiment of the invention.
FIG. 2B is a plan view of a concave bulk acoustic resonator (CBAR) according to an embodiment of the invention.

FIG. 2A illustrates a capacitive-type concave bulk acoustic resonator (CBAR) 20a having resonator body 22a (e.g., silicon) that is suspended opposite a recess (not shown) within a substrate 24a, 24b by a pair of opposing supports/anchors 15a, 15b located at opposite ends of the resonator body 22a. In contrast to the conventional bulk acoustic resonator 10 of FIG. 1, which includes a rectangular-shaped resonator body 12 suspended opposite a recess (not shown) in a substrate 14a, 14b, the CBAR 20a includes opposing concave-shaped sides. These sides curve inward relative to each other so that a minimum spacing at a center of the resonator body 22a is $\lambda/2$, where $\lambda$ is a wavelength associated with a resonant frequency of the resonator body 22a.

As further illustrated by FIG. 2A, a drive electrode (DRIVE) extends adjacent the first concave-shaped side of the resonator body 22a and a sense electrode (SENSE) extends adjacent a second concave-shaped side of the resonator body 22a. In contrast to the resonator 10 of FIG. 1, the width of the drive electrode (and sense electrode) as measured along the first concave-shaped side of the resonator body 22a is less than a spacing ($5\lambda$) between the first and second ends of the resonator body 22a. In particular, the width of the drive electrode as measured along the first concave-shaped side is preferably less than one-half a spacing between the first and second ends of the resonator body 22a and, more preferably, less than one-third a spacing between the first and second ends of the resonator body 22a.

Moreover, when the widths of the first and second ends of the resonator body 22a are equal to $3\lambda/4$, as illustrated by FIG. 2A, then these ends will act as an efficient sink for acoustic energy at the resonant frequency determined by the central width $\lambda/2$. Accordingly, because of the concave shape of the sides extending adjacent the drive and sense electrodes, the resonator 20a operates to concentrate acoustic energy near the central width $\lambda/2$ of the resonator body 22a and thereby supports a high quality (Q) of the resonator 20a by reducing acoustic losses at the relatively narrow supports 15a, 15b.

The concave-shaped resonator body 22a of the capacitive-type resonator 20a of FIG. 2A may be utilized within a piezoelectric-type resonator 20b of FIG. 2B. This resonator 20b is illustrated as including a piezoelectric layer 22b (e.g., ZnO) on a resonator body 22a (e.g., silicon) and first and second interdigitated electrodes 16a, 16b on the piezoelectric layer 22b. These electrodes 16a and 16b are patterned to include a plurality of finger-like extensions that operate to concentrate acoustic energy near the center of the resonator body 22a.

Figure 3:
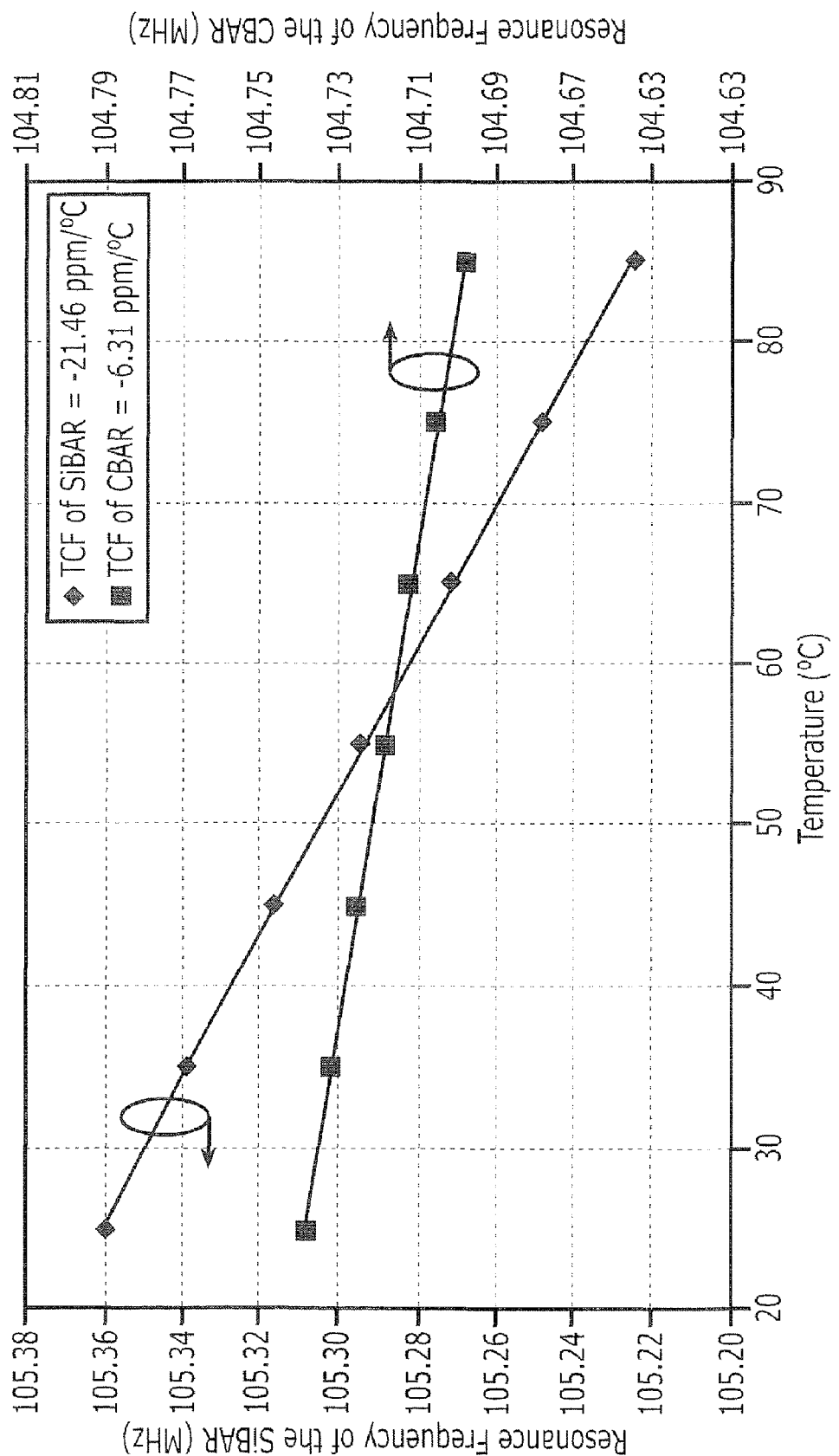
FIG. 3 includes a first graph of resonance frequency of the SiBAR of FIG. 1 versus temperature and a second graph of resonance frequency of the concave SiBAR of FIG. 2A versus temperature.
Figure 4:
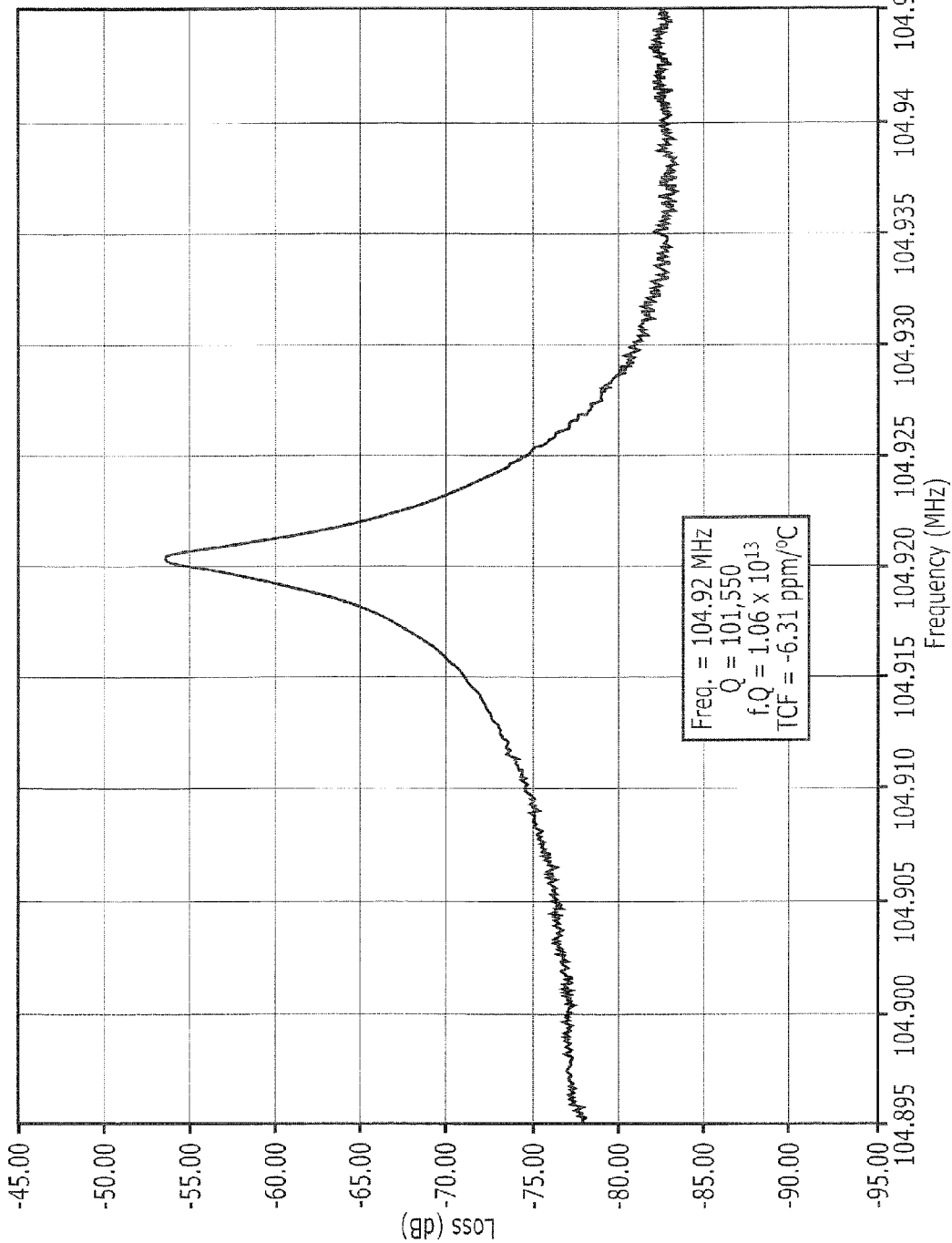
FIG. 4 is a graph that illustrates loss (dB) versus frequency for the CBAR of FIG. 2A (in vacuum).

A comparison of the TCF characteristics of the SiBAR of FIG. 1 versus the TCF characteristics of the CBAR of FIG. 2A is provided by FIG. 3. As illustrated by FIG. 3, a 100 MHz CBAR of FIG. 2A may exhibit a TCF of −6.31 ppm/° C., which is significantly lower than the TCF of −21.46 ppm/° C. of an otherwise equivalent 100 MHz SiBAR having a rectangular-shaped resonator body. These resonators were fabricated on the same boron-doped p-type silicon with a starting resistivity of about 0.001 Ω-cm. As illustrated by FIG. 4, the measured response of the CBAR in vacuum demonstrates a Q of 101,550 at 104.92 MHz and an fQ product of $1.06 \times 10^{13}$.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A concave bulk acoustic resonator (CBAR), comprising:
a substrate; and
a resonator body suspended over the substrate by a pair of fixed supports that attach to first and second opposing ends of said resonator body, said resonator body having a first concave-shaped side extending between the first and second ends of said resonator body, a second concave-shaped side extending opposite the first concave-shaped side and configured to have a minimum spacing of $\lambda/2$ between the first and second concave-shaped sides, where $\lambda$ is a wavelength associated with a resonant frequency of said resonator body.

2. The CBAR of claim 1, wherein said substrate comprises a drive electrode extending adjacent the first concave-shaped side and a sense electrode extending adjacent the second concave-shaped side.

3. The CBAR of claim 1, wherein a width of said resonator body at the first end thereof is about $3\lambda/4$.

4. A concave bulk acoustic resonator (CBAR), comprising:
a substrate; and
a resonator body suspended over the substrate by a pair of fixed supports that attach to first and second opposing ends of said resonator body, said resonator body having a first concave-shaped side extending between the first and second ends of said resonator body, a second concave-shaped side extending opposite the first concave-shaped side and configured to have a spacing of $\lambda/2$ between the first and second concave-shaped sides at a point midway between the first and second ends of said resonator body, where $\lambda$ is a wavelength associated with a resonant frequency of said resonator body.

5. The CBAR of claim 4, wherein a width of said resonator body at the first end thereof is about $3\lambda/4$.

6. A concave bulk acoustic resonator (CBAR), comprising:
a substrate;
a resonator body suspended over the substrate by a pair of fixed supports that attach to first and second opposing ends of said resonator body, said resonator body having a first concave-shaped side extending between the first and second ends of said resonator body and a second concave-shaped side extending opposite the first concave-shaped side;
a drive electrode extending adjacent the first concave-shaped side; and
a sense electrode extending adjacent the second concave-shaped side;
wherein a width of the drive electrode as measured along the first concave-shaped side is less than a spacing between the first and second ends of said resonator body.

7. The CBAR of claim 6, wherein the width of the drive electrode as measured along the first concave-shaped side is less than one-half a spacing between the first and second ends of said resonator body.

8. The CBAR of claim 6, wherein the width of the drive electrode as measured along the first concave-shaped side is less than one-third a spacing between the first and second ends of said resonator body.

9. The CBAR of claim 6, wherein a width of said resonator body at the first end thereof is about $3\lambda/4$.

10. A concave bulk acoustic resonator (CBAR), comprising:
a substrate;
a resonator body suspended over the substrate by a pair of fixed supports that attach to first and second opposing ends of said resonator body, said resonator body having a first concave-shaped side extending between the first and second ends of said resonator body and a second concave-shaped side extending opposite the first concave-shaped side;
a piezoelectric layer on said resonator body;
a first electrode extending across a first of the pair of fixed supports and onto said piezoelectric layer; and
a second electrode extending across a second of the pair of fixed supports and onto said piezoelectric layer.

11. The CBAR of claim 10, wherein the first and second electrodes comprise interdigitated fingers.

12. The CBAR of claim 11, wherein said resonator body is configured to have a minimum spacing of $\lambda/2$ between the first and second concave-shaped sides, where $\lambda$ is a wavelength associated with a resonant frequency of said resonator body.

13. The CBAR of claim 10, wherein said resonator body is configured to have a minimum spacing of $\lambda/2$ between the first and second concave-shaped sides, where $\lambda$ is a wavelength associated with a resonant frequency of said resonator body.

14. The CBAR of claim 13, wherein a width of said resonator body at the first end thereof is about $3\lambda/4$.

* * * * *